United States Patent
Takahashi et al.

(10) Patent No.: US 9,215,801 B2
(45) Date of Patent: Dec. 15, 2015

(54) VIA-HOLED CERAMIC SUBSTRATE, METALLIZED VIA-HOLED CERAMIC SUBSTRATE, AND METHOD FOR MANUFACTURING THE SAME

(75) Inventors: Naoto Takahashi, Yamaguchi (JP); Yasuyuki Yamamoto, Yamaguchi (JP)

(73) Assignee: TOKUYAMA CORPORATION, Shunan-shi, Yamaguchi (JP)

( * ) Notice: Subject to any disclaimer, the term of this patent is extended or adjusted under 35 U.S.C. 154(b) by 155 days.

(21) Appl. No.: 13/818,514

(22) PCT Filed: Dec. 2, 2011

(86) PCT No.: PCT/JP2011/077966
§ 371 (c)(1),
(2), (4) Date: Feb. 22, 2013

(87) PCT Pub. No.: WO2012/081425
PCT Pub. Date: Jun. 21, 2012

(65) Prior Publication Data
US 2013/0146340 A1   Jun. 13, 2013

(30) Foreign Application Priority Data

Dec. 13, 2010   (JP) .................................. 2010-276882

(51) Int. Cl.
*H05K 1/16*   (2006.01)
*H05K 1/03*   (2006.01)
(Continued)

(52) U.S. Cl.
CPC ............... *H05K 1/0306* (2013.01); *H01L 23/15* (2013.01); *H01L 23/49827* (2013.01);
(Continued)

(58) Field of Classification Search
CPC ............ H05K 1/02; H05K 1/03; H05K 1/10; H05K 1/11; H05K 1/092; H05K 3/10; H05K 3/34; H05K 3/40; H05K 3/3452; H01L 21/02; H01L 21/48; H01L 21/70; H01L 23/34; H01L 23/52; H01L 23/373; H01L 23/538; C03C 3/15; C04B 35/13; C09D 11/02; C09D 11/30
USPC ................. 174/260, 250, 255, 257, 258, 264; 361/306.3, 321.2, 321.5, 748; 257/702, 257/777; 156/60, 89.12; 438/433, 618; 252/519.3; 501/10, 32, 50
See application file for complete search history.

(56) References Cited

U.S. PATENT DOCUMENTS

| | | | |
|---|---|---|---|
| 4,861,646 A | * | 8/1989 | Barringer et al. ............. 428/210 |
| 4,870,539 A | * | 9/1989 | Chance et al. ............. 361/321.5 |

(Continued)

FOREIGN PATENT DOCUMENTS

| | | |
|---|---|---|
| JP | 5454798 A | 3/1989 |
| JP | 6454798 A | 3/1989 |

(Continued)

OTHER PUBLICATIONS

International Search Report, mailed Jan. 17, 2011, Appln. PCT/JP2011/077966.

*Primary Examiner* — Xiaoliang Chen
(74) *Attorney, Agent, or Firm* — Ladas & Parry LLP

(57) ABSTRACT

A via-holed ceramic substrate can be manufactured in a simple method by providing a via-holed ceramic substrate comprising: a sintered ceramic substrate; an electroconductive via formed in the sintered ceramic substrate, the electroconductive via having an electroconductive metal closely filled in a through-hole, the electroconductive metal containing a metal (A) having a melting point of 600° C. to 1100° C., a metal (B) having a melting point higher than the melting point of the metal (A), and an active metal; and an active layer formed in the interface between the electroconductive via and the sintered ceramic substrate.

7 Claims, 3 Drawing Sheets

(51) Int. Cl.
  *H05K 3/40* (2006.01)
  *H01L 23/15* (2006.01)
  *H01L 23/498* (2006.01)
  *H05K 3/00* (2006.01)
  *H01L 33/62* (2010.01)
  *H05K 3/24* (2006.01)
  *H05K 1/09* (2006.01)

(52) U.S. Cl.
  CPC ........... *H05K 3/0094* (2013.01); *H05K 3/4061* (2013.01); *H01L 33/62* (2013.01); *H01L 2924/0002* (2013.01); *H05K 1/092* (2013.01); *H05K 3/245* (2013.01); *H05K 2203/1476* (2013.01)

(56) References Cited

U.S. PATENT DOCUMENTS

| | | | | |
|---|---|---|---|---|
| 5,464,950 A * | 11/1995 | Horiuchi et al. | | 174/256 |
| 5,468,694 A * | 11/1995 | Taguchi et al. | | 501/77 |
| 5,581,876 A * | 12/1996 | Prabhu et al. | | 29/851 |
| 5,976,286 A * | 11/1999 | Natarajan | | 156/60 |
| 5,985,461 A * | 11/1999 | Tani et al. | | 428/433 |
| 6,136,419 A | 10/2000 | Fasano et al. | | 428/210 |
| 6,187,418 B1 * | 2/2001 | Fasano et al. | | 428/210 |
| 6,224,703 B1 * | 5/2001 | Yamasaki et al. | | 156/89.16 |
| 6,245,171 B1 * | 6/2001 | Natarajan et al. | | 156/89.11 |
| 6,258,192 B1 * | 7/2001 | Natarajan | | 438/387 |
| 6,312,791 B1 * | 11/2001 | Fasano et al. | | 428/210 |
| 6,370,013 B1 * | 4/2002 | Iino et al. | | 361/306.3 |
| 6,402,866 B1 * | 6/2002 | Casey et al. | | 156/89.12 |
| 6,414,835 B1 * | 7/2002 | Wolf et al. | | 361/302 |
| 6,542,352 B1 * | 4/2003 | Devoe et al. | | 361/321.2 |
| 6,607,780 B1 * | 8/2003 | Natarajan et al. | | 156/89.12 |
| 6,660,116 B2 * | 12/2003 | Wolf et al. | | 156/89.12 |
| 8,756,805 B2 | 6/2014 | Yamaguchi et al. | | |
| 2002/0011659 A1 * | 1/2002 | Nishide et al. | | 257/702 |
| 2002/0039645 A1 * | 4/2002 | Kawai et al. | | 428/210 |
| 2002/0166618 A1 * | 11/2002 | Wolf et al. | | 156/89.12 |
| 2003/0001454 A1 * | 1/2003 | Takeuchi et al. | | 310/311 |
| 2003/0045085 A1 * | 3/2003 | Taniguchi et al. | | 438/618 |
| 2003/0056981 A1 * | 3/2003 | Furukuwa | | 174/258 |
| 2003/0161090 A1 * | 8/2003 | Devoe et al. | | 361/321.2 |
| 2003/0161091 A1 * | 8/2003 | Devoe et al. | | 361/321.2 |
| 2003/0203169 A1 * | 10/2003 | Natarajan et al. | | 428/209 |
| 2004/0013860 A1 * | 1/2004 | Sumi et al. | | 428/209 |
| 2004/0023011 A1 * | 2/2004 | Sumi et al. | | 428/210 |
| 2004/0035693 A1 | 2/2004 | Ru | | |
| 2004/0043479 A1 * | 3/2004 | Briscoe et al. | | 435/288.5 |
| 2004/0154830 A1 * | 8/2004 | Furukuwa | | 174/258 |
| 2004/0155356 A1 * | 8/2004 | Furukuwa | | 257/777 |
| 2004/0184219 A1 * | 9/2004 | Otsuka et al. | | 361/306.3 |
| 2004/0201324 A1 * | 10/2004 | Takeuchi et al. | | 310/328 |
| 2005/0018382 A1 * | 1/2005 | Takazawa | | 361/321.2 |
| 2006/0128547 A1 * | 6/2006 | Takada et al. | | 501/10 |
| 2006/0234021 A1 * | 10/2006 | Tanei et al. | | 428/210 |
| 2006/0261364 A1 * | 11/2006 | Suehiro et al. | | 257/100 |
| 2007/0161266 A1 * | 7/2007 | Nishizawa | | 439/69 |
| 2007/0252523 A1 * | 11/2007 | Maeda et al. | | 313/506 |
| 2008/0119345 A1 * | 5/2008 | Takada et al. | | 501/51 |
| 2008/0188366 A1 * | 8/2008 | Nakamura et al. | | 501/32 |
| 2008/0223606 A1 * | 9/2008 | Tsukizawa et al. | | 174/260 |
| 2009/0032779 A1 * | 2/2009 | Toyoda et al. | | 252/519.3 |
| 2009/0051041 A1 * | 2/2009 | Otsuka et al. | | 257/774 |
| 2009/0105060 A1 * | 4/2009 | Takada et al. | | 501/50 |
| 2009/0251869 A1 * | 10/2009 | Ikeda et al. | | 361/748 |
| 2009/0321114 A1 * | 12/2009 | Takahashi et al. | | 174/257 |
| 2010/0038120 A1 * | 2/2010 | Kojima et al. | | 174/257 |
| 2010/0155118 A1 * | 6/2010 | Okada et al. | | 174/257 |
| 2011/0088831 A1 * | 4/2011 | Chikagawa | | 156/89.28 |
| 2011/0101399 A1 * | 5/2011 | Suehiro et al. | | 257/98 |
| 2011/0186336 A1 * | 8/2011 | Nakayama | | 174/255 |
| 2011/0286075 A1 * | 11/2011 | Bruchmann et al. | | 359/291 |
| 2013/0186675 A1 * | 7/2013 | Takahashi et al. | | 174/253 |

FOREIGN PATENT DOCUMENTS

| | | |
|---|---|---|
| JP | 2001-320172 A | 11/2001 |
| JP | 2002-016329 A | 1/2002 |
| JP | 2002-943740 A | 2/2002 |
| JP | 200204370 A | 2/2002 |
| JP | 2006-066752 A | 3/2006 |
| JP | 2006-196819 A | 7/2006 |
| JP | 2008-071843 A | 3/2008 |
| TW | 201043109 A | 12/2010 |

* cited by examiner

VIA-HOLED CERAMIC SUBSTRATE, METALLIZED VIA-HOLED CERAMIC SUBSTRATE, AND METHOD FOR MANUFACTURING THE SAME

TECHNICAL FIELD

The present invention relates to a via-holed ceramic substrate, a metallized via-hold ceramic substrate, and a method for manufacturing the same. More specifically, the present invention relates to a via-holed ceramic substrate and the like used to mount a semiconductor device such as an LED, and particularly to mount a semiconductor device such as a high-output LED which releases heat.

BACKGROUND ART

A ceramic substrate for mounting a semiconductor device has a metallized pattern to be connected to an electrode of the semiconductor device, formed on a face(s) of the ceramic substrate. Moreover, if the ceramic substrate is used, for example, as a multilayer substrate or a submount, an electroconductive via for conduction between upper and lower portions of the substrate is formed on the ceramic substrate (hereinafter, the ceramic substrate having the electroconductive via and the metallized pattern is referred to as a "metallized via-holed ceramic substrate" in some cases).

As a method for manufacturing the metallized via-holed ceramic substrate, a co-firing method (simultaneous firing method) and a post-firing method (sequential firing method) are known. In the co-firing method, a metal paste layer is formed on an unfired ceramic substrate precursor referred to as a green sheet, or a metal paste is filled into a through-hole formed in the green sheet, to prepare and fire a metallized via-holed ceramic substrate precursor. In this method, the green sheet and the metal paste are simultaneously fired.

In the post-firing method, a metal paste layer is formed on a sintered substrate obtained by firing a green sheet, or a metal paste is filled into a through-hole formed in the sintered substrate, to prepare and fire a metallized via-holed ceramic substrate precursor. In this method, the green sheet and the metal paste are sequentially fired.

Either method allows the metallized pattern to be formed on the ceramic substrate, and the substrate obtained in the method is used as a substrate for mainly mounting electronic components. In the co-firing method, however, the green sheet tends to unevenly contract upon firing, and if, for example, a square green sheet is sintered, a central portion on each side thereof contracts to warp inward slightly, and the substrate deforms into a star shape. Thus, if many metallized patterns and electroconductive vias having the same shape are formed on one green sheet, a slight change in the shape of the patterns and in the position of the vias depending on the location of the patterns is unavoidable. Moreover, in the co-firing method, the green sheet and the metal paste are simultaneously fired at high temperature, and thus, the co-firing method has such a disadvantage that it is necessary to use a high-melting-point metal paste of molybdenum, tungsten etc., as the metal paste, and that other metals excellent in conductivity cannot be used.

On the other hand, in the post-firing method, the metal paste layer is formed on the sintered ceramic substrate, or the metal paste is filled into the through-hole formed in the sintered ceramic substrate, to fire the metal paste, by which the metallized pattern and the electroconductive via are formed. Upon firing of the metal paste layer, the metal paste layer contracts in its thickness direction, but hardly contracts in its plane direction. Thus, there is not any problem that the pattern shape varies depending on the location, as is seen in the co-firing method.

However, since the metal paste itself does contract, contraction of the metal paste in the through-hole occurs upon sintering, thus causing voids in the formed electroconductive via, and making it difficult to form a dense via.

Patent document 1 discloses that a titanium layer and a copper layer are formed, by sputtering, on a ceramic substrate having a through-hole and are then plated with copper to form a wiring pattern and an electroconductive via. Since the method requires the step of sputtering, a manufacturing facility for the sputtering is required, and the method does not allow simple manufacturing of the metallized via-hold substrate. Moreover, in filling copper into the through-hole by plating in this method, if the diameter of the through-hole or the thickness of the substrate increases, more time will be required for the filling, causing degradation in the productivity. In this point, the method still needs improvement.

RELATED ART DOCUMENT

Patent Document

Patent document 1: US Patent Application Publication No. 2004/00359693

SUMMARY OF THE INVENTION

Problems to be Solved by the Invention

It is therefore an object of the present invention to provide a via-holed ceramic substrate and a metallized via-holed ceramic substrate, which can be manufactured in a simple method, and a method for manufacturing the substrates.

Means for Solving the Problems

Hereinafter, the present invention will be explained. The reference numerals in the attached drawings are shown in parentheses to facilitate understanding of the present invention; however, the present invention is not limited to the illustrated forms. It should be noted that in the specification, "A to B" means "no less than A and no more than B", unless otherwise specified. Moreover, in the specification, a mean particle diameter is a sphere equivalent diameter (volume mean D50) which gives the median of a volume distribution measured by laser diffractometry using Microtrack manufactured by Nikkiso Co., Ltd.

A first aspect of the present invention is a via-holed ceramic substrate comprising: a sintered ceramic substrate; an electroconductive via formed in the sintered ceramic substrate, the electroconductive via having an electroconductive metal closely filled in a through-hole, the electroconductive metal containing a metal (A) having a melting point of 600° C. to 1100° C., a metal (B) having a melting point higher than the melting point of the metal (A), and an active metal; and an active layer formed in the interface between the electroconductive via and the sintered ceramic substrate. Hereinafter, the electroconductive via is simply referred to as a via in some cases.

The "metal (B) having a melting point higher than the melting point of the metal (A)" does not necessarily mean a metal having a melting point of over 1100° C., but means a metal having a melting point higher than the melting point of the metal (A) actually used. For example, if the metal (A) is silver solder having a melting point of about 780° C., a metal having a melting point higher than the melting point of the metal (A), that is, copper (melting point: 1085° C.), silver (melting point: 962° C.), gold (melting point: 1064° C.), and the like can be used as the metal (B).

As the "metal (A) having a melting point of 600° C. to 1100° C.", for example, copper, silver, gold, and a solder material such as gold solder and silver solder, can be listed. Moreover, as the "metal (B) having a melting point higher than the melting point of the metal (A)", for example, copper (melting point: 1085° C.), silver (melting point: 962° C.), gold (melting point: 1064° C.), tungsten (melting point: 3410° C.), molybdenum (melting point: 2617° C.) and the like can be listed, and the metal (B) is selected based on the melting point of the metal (A) to be used.

In the first aspect of the present invention, the "metal (A) having the melting point of 600° C. to 1100° C." is preferably one or more selected from a group consisting of gold solder, silver solder, and copper.

In the first aspect of the present invention, the "metal (B) having the melting point higher than the melting point of the metal (A)" is preferably one or more selected from a group consisting of silver, copper, and gold.

In the first aspect of the present invention, the "active layer" is preferably a reaction layer formed by a reaction of the active metal and a ceramic component of the sintered ceramic substrate. More preferably, the active metal is titanium, the ceramic component to react with the titanium is nitrogen, and the active layer is a titanium nitride layer. The formation of the active layer provides good adhesion between the via and a wall surface of the sintered ceramic substrate.

In the first aspect of the present invention, the sintered ceramic substrate is preferably a sintered aluminum nitride substrate. The via-holed ceramic substrate of the first aspect of the present invention has a via with good electroconductivity and is suitable for mounting an element which requires high power supply, such as a high-output LED. The element such as the high-output LED releases large amount of heat. The heat stored in the vicinity of the element has an adverse effect on the element, and thus the heat is preferably released to the outside. From this viewpoint, the sintered ceramic substrate is preferably made of aluminum nitride with high thermal conductivity.

A second aspect of the present invention is a metallized via-holed ceramic substrate comprising: the via-holed ceramic substrate of the first aspect of the present invention; and a wiring pattern formed on a front face and/or a back face of the via-holed ceramic substrate, the wiring pattern having an electroconductive metal containing a metal (A), a metal (B), and an active metal. Further, an active layer is preferably formed between the metallized pattern and the sintered ceramic substrate.

A third aspect of the present invention is a method for manufacturing the via-holed ceramic substrate (100a) of the first aspect of the present invention, comprising the steps of:

(i) preparing a sintered ceramic substrate (10) having a through-hole (12);

(ii) filling a first metal paste (20) into the through-hole (12), the first metal paste containing a powder of a metal (B) having a higher melting point than a melting point of a metal (A), and a powder of an active metal;

(iii) layering a second metal paste containing a powder of the metal (A) having a melting point of 600° C. to 1100° C., thereby forming a second metal paste layer (22) where the second metal paste contacts with the first metal paste (20) filled in the through-hole (12); and (iv) firing the substrate obtained via the steps (i) to (iii).

In the via-holed ceramic substrate (100a), an electroconductive via (23) is formed by firing the first metal paste (20) filled in the through-hole (12) and the second metal paste layer (22).

According to the third aspect of the present invention, in the firing step, when the powder of the metal (B) in the through-hole (12) sinters and contracts, the metal (A) melted flows into voids in the powder of the metal (B) in the through-hole (12), and thereby a dense electroconductive via (23) with good electroconductivity is formed. Moreover, the active metal reacts with the ceramic component, thereby forming the active layer in the interface between the electroconductive via (23) and the sintered ceramic substrate (10). This provides good adhesion between the electroconductive via (23) and the sintered ceramic substrate (10).

A fourth aspect of the present invention is a method for manufacturing the metallized via-holed ceramic substrate (100b) of the second aspect of the present invention, comprising the steps of:

(i) preparing a sintered ceramic substrate (10) having a through-hole (12);

(ii) filling a first metal paste (20) into the through-hole (12), the first metal paste containing a powder of a metal (B) having a higher melting point than a melting point of a metal (A), and a powder of an active metal;

(iii) layering a second metal paste containing a powder of the metal (A) having a melting point of 600° C. to 1100° C., thereby forming a second metal paste layer (22) where the second metal paste contacts with the first metal paste (20) filled in the through-hole (12);

(iv) firing the substrate obtained via the steps (i) to (iii) and thereafter;

(v) layering a third metal paste containing a powder of the metal (B) having a higher melting point than the melting point of the metal (A), and a powder of the active metal, thereby forming a third metal paste layer (24) in a position to form a wiring pattern;

(vi) layering a fourth metal paste containing a powder of the metal (A) having a melting point of 600° C. to 1100° C., thereby forming a fourth metal paste layer (26) on the third metal paste layer (24); and (vii) firing the substrate obtained via the steps (i) to (vi).

In the metallized via-holed ceramic substrate (100b), an electroconductive via (23) is formed by firing the first metal paste (20) filled in the through-hole (12) and the second metal paste layer (22).

As in the method of the third aspect of the present invention described above, in the fourth aspect of the present invention, the via-holed ceramic substrate (100a) having the dense electroconductive via (23) with good electroconductivity and having good adhesion between the electroconductive via (23) and the sintered ceramic substrate (10) is produced in the step of the first firing. In the step of the second firing, when the metal (B) in the third metal paste layer (24) sinters and contracts, the metal (A) in the fourth metal paste layer (26) melts and flows into the metallized pattern, and thus, a dense metallized pattern (25) with good electroconductivity is formed. Moreover, the active metal in the third metal paste layer reacts with the ceramic component to form the active layer, by which the metallized pattern (25) having good adhesion is formed on the face(s) of the substrate.

The first metal paste and the third metal paste, which contain the powder of the metal (B) and the powder of the active metal, may be the same metal paste. However, the step of filling the metal paste into the through-hole and the step of printing the electroconductive pattern onto the face(s) of the substrate may require different viscosity characteristics of the metal paste and different optimal particle sizes of the powder of the metal in some cases. Thus, it is preferable to use metal pastes suitable for the respective manufacturing steps. Moreover, the second metal paste and the fourth metal paste, which contain the powder of the metal (A), may be the same metal paste, and preferably the same metal paste from the viewpoint of productivity The same applies in a fifth aspect of the present invention as well.

A fifth aspect of the present invention is a method for manufacturing the metallized via-holed ceramic substrate (100c) of the second aspect of the present invention, comprising the steps of:

(i) preparing a sintered ceramic substrate (10) having a through-hole (12);

(ii) filling a first metal paste (20) into the through-hole (12), the first metal paste containing a powder of a metal (B) having a higher melting point than a melting point of a metal (A), and a powder of an active metal;

(iii) layering a third metal paste containing a powder of the metal (B) having a higher melting point than the melting point of the metal (A), and a powder of the active metal, thereby forming, in a position to form a wiring pattern, a third metal paste layer (24) where the third metal paste contacts with the first metal paste;

(iv) layering a fifth metal paste containing a powder of the metal (A) having a melting point of 600° C. to 1100° C., thereby forming a fifth metal paste layer (27) on the third metal paste layer; and (v) firing the substrate obtained via the steps (i) to (iv).

In the metallized via-holed ceramic substrate (100c), an electroconductive via (23) is formed by firing the first metal paste (20) filled in the through-hole (12), the third metal paste layer (24), and the fifth metal paste layer (27), and at the same time, a metallized pattern (25) connected to the electroconductive via (23) is formed.

In the fifth aspect of the present invention, in the firing step, when the metal (B) in the through-hole (12) and the metal (B) in the third metal paste layer (24) sinter and contract, the metal (A) in the fifth metal paste layer (27) melts and flows into voids in the powder of the metal (B) in the through-hole (12) and voids in the powder of the metal (B) in the third metal paste layer (24). By this, the electroconductive via (23) and the metallized pattern (25) which are dense and have good electroconductivity are formed. Moreover, since the first metal paste and the third metal paste each has the active metal, the active metal reacts with the ceramic component, thereby forming the active layer between the electroconductive via (23) and the sintered ceramic substrate (10), and between the metallized pattern (25) and the sintered ceramic substrate (10). This provides good adhesion between the electroconductive via (23) and the sintered ceramic substrate (10), and between the metallized pattern (25) and the sintered ceramic substrate (10).

BRIEF DESCRIPTION OF DRAWINGS

FIG. 3 are element mapping photographs in the vicinity of the interface between a sintered aluminum nitride substrate and the electroconductive via in the metallized via-holed ceramic substrate obtained in Example 7.

MODE FOR CARRYING OUT THE INVENTION

<Method for Manufacturing Via-Holed Ceramic Substrate (Third Aspect of the Present Invention)>

The method for manufacturing the via-holed ceramic substrate of the present invention comprises the following steps of:

(i) preparing a sintered ceramic substrate having a through-hole;

(ii) filling a first metal paste into the through-hole, the first metal paste containing a powder of a metal (B) having a higher melting point than a melting point of a metal (A), and a powder of an active metal;

(iii) layering a second metal paste containing a powder of the metal (A) having a melting point of 600° C. to 1100° C., thereby forming a second metal paste layer where the second metal paste contacts with the metal paste filled in the through-hole; and (iv) firing the substrate obtained via the steps (i) to (iii).

(Step (i))

Figure 1A:
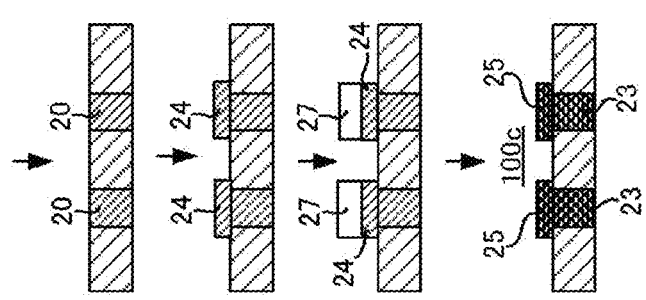
FIG. 1A is a conceptual diagram illustrating each step of the method for manufacturing the via-holed ceramic substrate 100a, in the third aspect of the present invention.

With reference to FIG. 1A, each step will be explained. Firstly, in the step (i), a sintered ceramic substrate 10 having a through-hole 12 is prepared. As the sintered ceramic substrate 10, a known substrate made of ceramics can be used without particular restriction.

Examples of the ceramics to constitute the sintered ceramic substrate 10 are (1) oxide-based ceramics, such as aluminum oxide-based ceramics, silicon oxide-based ceramics, calcium oxide-based ceramics, and magnesium oxide-based ceramics; (2) nitride-based ceramics, such as aluminum nitride-based ceramics, silicon nitride-based ceramics, and boron nitride-based ceramics; (3) beryllium oxide, silicon carbide, mullite, borosilicate glass, and the like. Among them, (2) the nitride-based ceramics are preferred, and particularly, the aluminum nitride-based ceramics can be preferably used due to high thermal conductivity thereof.

As the sintered ceramic substrate 10 used in the manufacturing method of the present invention, for the reasons of easiness of availability and easiness of obtaining a desired shape, a sintered ceramic substrate containing ceramic particles with a mean particle diameter of preferably 0.5 to 20 μm, and more preferably 1 to 15 μm is used. Such a sintered ceramic substrate can be obtained by firing a green sheet containing a ceramic base powder with a mean particle diameter of 0.1 to 15 μm, and preferably 0.5 to 5 μm.

The green sheet may contain a sintering aid, an organic binder, and the like. As the sintering aid, a sintering aid normally used in accordance with the type of the ceramic base powder can be used without particular restriction. Moreover, as the organic binder, polyvinyl butyral, ethyl celluloses, and acrylic resins are used. For the reason of good formability of the green sheet, poly(n-butyl methacrylate) and polyvinyl butyral are particularly preferably used.

From the viewpoint of the thermal conductivity of an obtained sintered body, it is preferable to use a green sheet for nitride ceramics formed by using, as the ceramic base powder, a nitride ceramic powder containing the sintering aid, and particularly a green sheet for aluminum nitride using, as the base powder, an aluminum nitride powder containing the sintering aid (e.g. yttrium, calcium oxide).

The shape of the sintered ceramic substrate 10 used in the present invention is not particularly limited as long as the shape allows the formation of the through-hole, and a plate-shaped body or a body obtained by partially cutting the plate-shaped body can be also used. The size of the sintered ceramic substrate 10 is not particularly limited and may be adequately determined depending on the application thereof. For example, if the sintered ceramic substrate 10 is to be used as a substrate for mounting electronic components, the thickness of the substrate is generally 0.1 to 2 mm, and may be preferably 0.2 to 1 mm.

In the sintered ceramic substrate 10 described above has the through-hole 12 formed. A method of forming the through-hole 12 is not particularly limited. The through-hole 12 may be formed by mechanical drilling using a drill, or may be drilled by dissolving ceramics in a method using chemicals, or may be formed by adopting laser processing, blast processing, or the like. Moreover, in the application that does not strictly require the positional accuracy of the through-hole 12, a green sheet having a through-hole formed in advance by punching processing may be fired to prepare the sintered ceramic substrate 10 having the through-hole 12. The diameter of the through-hole 12 is normally set to be 0.05 mm to 0.5 mm.

The through-hole 12 is basically a through-hole vertically passing through the substrate 10, but in cases where the substrate 10 has internal wiring, it may be a hole having an opening only at one end. Such a hole is also included in the through-hole 12 of the present invention.

(Step (ii))

Then, a first metal paste 20 is filled into the through-hole 12, wherein the first metal paste contains a powder of a metal (B) having a higher melting point than a melting point of a metal (A), and a powder of an active metal. The first metal paste 20 contains the powder of the metal (B) and the powder of the active metal, and may further contain an organic binder, an organic solvent, a dispersant, a plasticizer, and the like.

The "metal (B)" is a metal having a higher melting point than the melting point of the metal (A). Thus, firstly, the "metal (A)" will be explained. The metal (A) is a metal having a melting point of 600° C. to 1100° C., and examples thereof are: copper, silver, gold, and a solder material such as gold solder and silver solder. Among them, it is preferable to use, as the metal (A), one or more selected from a group consisting of gold solder, silver solder, and copper from the viewpoint of cost. If the melting point of the metal (A) is less than 600° C., it is hard to form an active layer explained later, between a via 23 and the sintered ceramic substrate 10 by the firing. Moreover, if the melting point of the metal (A) is greater than 1100° C., excessive heat is applied to the substrate upon firing, and stress in the formation of the via likely remains in the substrate.

Moreover, the expression, "having a higher melting point than the melting point of the metal (A)" does not necessarily mean that the melting point is greater than 1100° C., but means that the melting point of the metal (B) is higher than the melting point of the metal (A) actually used. For example, if the metal (A) is silver solder having a melting point of about 780° C., a metal having a higher melting point than 780° C. can be used as the metal (B).

Examples of the metal (B) are copper (melting point: 1085° C.), silver (melting point: 962° C.), gold (melting point: 1064° C.), tungsten (melting point: 3410° C.), molybdenum (melting point: 2617° C.) and the like; and the metal (B) is selected based on the melting point of the metal (A). Among them, one or more selected from a group consisting of silver, copper, and gold is preferably used as the metal (B), from the viewpoint of high conductivity. The metal (B) may be used in combination of two or more as long as the melting point of the metal (B) is higher than that of the metal (A).

The mean particle diameter (D50) of the powder of the metal (B) is preferably 1 to 50 μm in order to improve productivity and manufacture the via-holed ceramic substrate and the metallized via-holed ceramic substrate that have excellent performance, although it may need to be balanced with the size of other metal powders and the size of the through-hole. Moreover, two or more types of powders having different mean particle diameters can be also used as the powder of the metal (B), to increase the packing density of the powder of the metal (B) in the through-hole 12. The mean particle diameter (D50) is a volume median diameter measured by laser diffractometry using Microtrack manufactured by Nikkiso Co., Ltd.

A difference in melting point between the metal (A) and the metal (B) is preferably 50° C. or more, more preferably, 100° C. or more, and still more preferably 150° C. or more. By setting the difference in melting point to be 50° C. or more, it is possible, in the firing step, to melt the metal (A) with the shape of the via maintained, without melting the metal (B), and to fill the melted metal (A) into voids formed during the sintering of the metal (B), thereby enabling formation of the dense via. An upper limit of the difference in melting point is not particularly limited; however, in view of usual manufacturing conditions, it is 3000° C., and more preferably 1000° C. If two or more types of metals (B) are used, the difference in melting point between the metal (A) and all types of the metals (B) preferably satisfies the above range.

The "powder of the active metal" is a powder of a metal which is reactive with a ceramic component and forms an active layer in an interface with the sintered ceramic substrate 10 by the reaction with the ceramic component. The powder of the active metal can be a titanium powder or a titanium hydride powder. Among them, the titanium hydride powder is preferably used in view of production stability. If a nitride ceramic substrate is used as the sintered ceramic substrate 10, the use of a metal paste containing the titanium hydride powder allows a titanium nitride layer, which is the active layer, to be formed between the electroconductive via 23 formed by the firing and a wall surface of the sintered ceramic substrate 10. This improves adhesion between the electroconductive via 23 and the sintered ceramic substrate 10. Thus, it is effective in the case of using a paste of gold, silver, copper, or a copper-silver alloy which exhibits less adhesion with ceramics. The amount of the powder of the active metal added is preferably 1 to 10 parts by mass, and more preferably 1.5 to 6 parts by mass, based on 100 parts by mass of the powder of the metal (B) in the first metal paste 20, in view of the adhesion and conductivity of the via.

The mean particle diameter (D50) of the powder of the active metal is preferably set to be 1 to 50 μm in order to improve productivity and manufacture the via-holed ceramic substrate and the metallized via-holed ceramic substrate that have excellent performance, particularly improved adhesion of the electroconductive via 23 and excellent conductivity, although it may need to be balanced with the size of other metal powders and the size of the through-hole. Herein, the mean particle diameter (D50) is a volume median diameter measured by laser diffractometry using Microtrack produced by Nikkiso Co., Ltd.

As the organic binder to be contained in the first metal paste 20, a known binder can be used without particular restriction. For example, it is possible to use one or a mixture of two or more selected from acrylic resin such as polyacrylate and polymethacrylate, cellulose-based resin such as methylcellulose, hydroxymethyl cellulose, nitrocellulose, and cellulose acetate butyrate, polyvinyl resin such as polyvinylbutyral, polyvinylalcohol, and polyvinyl(chloride), hydrocarbon resin such as polyolefin, oxygenated resin such as polyethylene oxide, and the like.

As the organic solvent to be contained in the first metal paste 20, a known solvent can be used without particular restriction. For example, toluene, ethyl acetate, terpineol, butyl carbitol acetate, texanol, and the like can be used. As the dispersant to be contained in the first metal paste 20, a known dispersant can be used without particular restriction. For example, a phosphate-based dispersant, a polycarboxylic acid-based dispersant, and the like can be used. As the plasticizer to be contained in the first metal paste 20, a known plasticizer can be used without particular restriction. For example, dioctyl phthalate, dibutyl phthalate, diisononyl phthalate, diisodecyl phthalate, dioctyl adipate, and the like can be used.

A method of filling the first metal paste 20 into the through-hole 12 is not particularly limited and is performed using a known screen printing apparatus, an apparatus for pressure filling and filling the paste, or the like. The first metal paste 20 is filled such that the through-hole 12 is uniformly filled therewith. Considering that the metal (B) contained in the first metal paste 20 contracts upon drying and sintering, the first metal paste 20 may be filled in a manner protruding upward and downward from the through-hole 12.

Herein, the first metal paste 20 containing the powder of the metal (B) and the powder of the active metal is preferably adjusted to have a viscosity of 50 to 3000 Pa·s at 25° C. in a state containing the organic solvent and the organic binder, in view of productivity of the via-holed ceramic substrate and the metallized via-holed ceramic substrate.

(Step (iii))

A second metal paste contains a powder of the metal (A) described above and may contain another component as in the first metal paste. The second metal paste is layered to form a second metal paste layer 22 where the second metal paste contacts with the first metal paste 20 filled in the through-hole 12. As the powder of the metal (A), the same type as described in the step (ii) is used.

In the firing step, the melted metal (A) only needs to flow into the voids among the powder particles of the metal (B) filled in the through-hole 12, so the second metal paste layer 22 may be formed in any position where the second metal paste layer 22 contacts with the first metal paste 20. However, the second metal paste layer 22 is preferably formed on the first metal paste 20 in the through-hole 12. This configuration enables the melted metal (A) to easily flow into the via, upon firing, due to its weight.

The second metal paste layer 22 may be layered in an amount which allows the voids to be filled, the voids being likely generated in the via formed. The amount of the metal (A) in the second metal paste layer 22 is preferably 20 parts by mass or more, and more preferably 40 parts by mass or more, and preferably 150 parts by mass or less, and more preferably 100 parts by mass or less, based on 100 parts by mass of the metal (B) in the first metal paste 20 in the through-hole 12.

The mean particle diameter (D50) of the powder of the metal (A) contained in the second metal paste is preferably 0.1 to 50 µm in order to improve productivity and to manufacture the via-holed ceramic substrate and the metallized via-holed ceramic substrate that have excellent performance, although it may need to be balanced with the size of other metal powders and the size of the through-hole. Herein, the mean particle diameter (D50) is a volume median diameter measured by laser diffractometry using Microtrack produced by Nikkiso Co., Ltd.

The second metal paste layer 22 can be formed by a known method such as screen printing, calendar printing, and pad printing of the second metal paste.

Herein, the second metal paste containing the powder of the metal (A) is preferably adjusted to have a viscosity of 20 to 1000 Pa·s at 25° C. in a state containing the organic solvent and the organic binder, in view of productivity of the via-holed ceramic substrate and the metallized via-holed ceramic substrate.

(Step (iv))

Lastly, the substrate obtained via the steps (i) to (iii) is fired. The firing may be performed at a temperature which is greater than or equal to the melting point of the metal (A) and less than the melting point of the metal (B), depending on the type of the metal paste used (more specifically, the nature of the powder of the metal in the metal paste). For other conditions, usually adopted conditions are used, as occasion demands.

For example, if a powder of Ag—Cu alloy with a melting point of 780° C. is used as the metal (A) and copper is used as the metal (B), the firing may be performed at 780 to 1050° C., preferably at 800 to 950° C., for 1 minute to 1 hour, preferably 5 to 30 minutes.

Moreover, according to the present invention, when a high-melting-point metal, such as tungsten and molybdenum, is used as the metal (B), the via-holed ceramic substrate can be manufactured at a lower temperature than a conventional firing temperature. For example, when the high-melting-point metal is used, the firing usually needs to be performed at a temperature of 1600 to 2000° C. in order to sinter the high-melting-point metal. In the present invention, however, the second metal paste layer 22 containing the powder of the metal (A) is used; therefore, if the firing is performed at a temperature greater than or equal to the melting point of the metal (A), even if the temperature does not cause complete sintering of the high-melting-point metal, the metal (A) melts and permeates into the powder of the high-melting-point metal, thereby enabling formation of the electroconductive via with good conductivity.

Moreover, the first metal paste 20 contains the powder of the active metal (e.g. a powder of titanium hydride) to provide adhesion with the sintered ceramic substrate 10. Thus, the firing is preferably performed in a non-oxidizing atmosphere in a heat-resistant container.

Examples of the non-oxidizing atmosphere are a vacuum atmosphere, or an atmosphere of an inert gas such as argon gas and helium gas, and an atmosphere of hydrogen gas. Moreover, it may be a mixed atmosphere of the inert gas and the hydrogen gas. Among these non-oxidizing atmospheres, the vacuum atmosphere or the mixed atmosphere of the inert gas and the hydrogen gas is preferably adopted. When the firing is performed under vacuum, the degree of vacuum is preferably as high as possible to prevent a reactive gas such as oxygen and nitrogen in the atmosphere from reacting with titanium, and is preferably $1.33 \times 10^{-1}$ Pa or less, and more preferably $1.33 \times 10^{-2}$ Pa or less. The upper limit of the degree of vacuum is not particularly limited but may be $1.33 \times 10^{-4}$ Pa or more in view of industrial production.

The heat-resistant container only needs to be formed of a material which is sufficiently resistant to the firing temperature, and is preferably a container which does not permeate gas, does not generate gas, and is highly hermetic even in the high temperature upon firing. Specific examples of the material to be preferably used for the heat-resistant container include: a nitride sinter such as aluminum nitride, boron nitride, and silicon nitride; an oxide sinter such as alumina, magnesia, and zirconia; heat-resistant alloys such as Incoloy and Hastelloy; and quartz glass. Among them, the nitride sinter which is excellent in thermal conductivity is preferred in view of ensuring heat evenness in the container upon firing.

The heat-resistant container is considered to function, in the firing step, to block an atmosphere in the vicinity of the substrate from the other atmosphere in the firing furnace and to inhibit contaminants such as decomposition products of a binder component in a paste decomposed, scattered and deposited on a wall of the furnace and so on, from reacting with a titanium component in the metal paste layer by being re-scattered with increasing temperature inside the furnace. Thus, the heat-resistant container used preferably has a structure that can have a lid put thereon so that the atmosphere in the vicinity of the substrate can be blocked from the other atmosphere in the firing furnace in the firing step. The heat-resistant container may be completely closed, but may also have a gap to the extent that a gas generated by the pyrolysis of the binder in the metal paste can be released out of the container.

The shape of the heat-resistant container is preferably in a size which does not cause any temperature distribution in the heat-resistant container in the firing furnace. Even for this reason, the heat-resistant container is preferably a container made of the nitride sinter which is excellent in thermal conductivity.

In the aspect described above, the presence of the second metal paste layer 22, which does not contain the powder of the active metal, prevents the active metal component in the first metal paste 20 from moving to an exposed surface of the via 23. Moreover, by adopting the particular firing conditions described above, it is possible to effectively prevent the active metal component from moving to the exposed surface of the via 23. By this, when the particular firing conditions described above are adopted, the active layer is sufficiently formed in the interface between the electroconductive via 23 and the ceramic sinter 10, thereby providing good adhesion therebetween.

In the method for manufacturing the via-holed ceramic substrate 100a of the present invention described above, in the firing step, the metal (A) in the second metal paste layer 22 melts and flows into the voids in the powder of the metal (B) filled in the through-hole 12. By this, even if the metal (B) in the first metal paste 20 sinters and contracts, the dense via 23 is formed due to the melted metal (A) flowing into the voids.

Herein, an electroconductive metal layer formed as the via 23 may have a sea-island structure in which the metal (B) is the island and the metal (A) is the sea, with the particle shape of the metal (B) before firing maintained to some extent. Moreover, the electroconductive metal layer may have a structure in which the metal (A) is mixed in the metal (B) or in which the metal (B) is mixed in the metal (A).

The metal which constitutes the via 23 obtained after the firing may have a configuration of the island mainly composed of the metal (A) and the sea mainly composed of the metal (B), and may also have a configuration of the metal (A) and the metal (B) completely solid-dissolved, depending on the nature and blending quantity of the metal (A) and the metal (B). For example, when silver solder is used as the metal (A) and copper is used as the metal (B), a solid phase containing copper (partially having silver and the active metal solid-dissolved therein) and a liquid phase in which copper (and the active metal) is dissolved in silver solder (silver-copper) exist upon firing, and are then phase-separated into a phase mainly composed of copper and a phase mainly composed of silver upon cooling and solidification after the firing. This ends up providing a material structure in which the phase mainly composed of copper is the sea and the phase mainly composed of silver is the island. Thus, the melting points of the metal (A) and the metal (B) blended as the metal paste may differ from the melting points of the metal which constitutes the island and the metal which constitutes the sea in the metal in the via obtained after the firing.

<First Method for Manufacturing Metallized Via-Holed Ceramic Substrate (Fourth Aspect of the Present Invention)>

A first method for manufacturing the metallized via-holed ceramic substrate comprises the following steps of:

(i) preparing a sintered ceramic substrate having a through-hole;

(ii) filling a first metal paste into the through-hole, the first metal paste containing a powder of a metal (B) having a higher melting point than a melting point of a metal (A), and a powder of an active metal;

(iii) layering a second metal paste containing a powder of the metal (A) having a melting point of 600° C. to 1100° C., thereby forming a second metal paste layer where the second metal paste contacts with the first metal paste filled in the through-hole;

(iv) firing the substrate obtained via the steps (i) to (iii) and thereafter;

(v) layering a third metal paste containing a powder of the metal (B) having a higher melting point than the melting point of the metal (A), and a powder of the active metal, thereby forming a third metal paste layer in a position to form a wiring pattern;

(vi) layering a fourth metal paste containing a powder of the metal (A) having a melting point of 600° C. to 1100° C., thereby forming a fourth metal paste layer on the third metal paste layer; and (vii) firing the substrate obtained via the steps (i) to (vi).

Figure 1B:
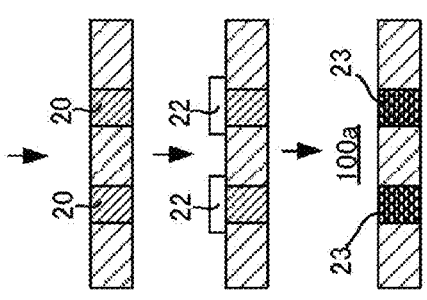
FIG. 1B is a conceptual diagram illustrating each step of the method for manufacturing the metallized via-holed ceramic substrate 100b, in the fourth aspect of the present invention.

Hereinafter, with reference to FIG. 1B, each step will be explained. The above steps (i) to (iv) are the same as the steps (i) to (iv) in the method for manufacturing the via-holed ceramic substrate 100a (third aspect of the present invention) descried above, and the first metal paste and the second metal paste are the same as those explained in the third aspect of the present invention. In the method for manufacturing the metallized via-holed ceramic substrate 100b of the present invention, a metallized pattern 25 is formed by the steps (v) to (vii) on a side of the via-holed ceramic substrate 100a described above where an element is mounted.

(Step (v))

A third metal paste contains a powder of the metal (B) and a powder of the active metal and may be the same as the first metal paste described above. However, the step of filling the metal paste into the through-hole and the step of printing an electroconductive pattern onto a face(s) of the substrate requires different viscosity characteristics of the metal paste and different optimal particle sizes of the powder of the metal. Thus, it is preferable to use metal pastes suitable for the respective manufacturing steps.

Specifically, the mean particle diameter (D50) of the powder of the metal (B) contained in the third metal paste is preferably 0.1 to 20 µm. As the powder of the metal (B), two or more types of powders having different mean particle diameters can be also used to form a dense metallized pattern 25. Moreover, the powder of the metal (B) may be used in combination of two or more types as long as the melting point of the metal (B) is higher than the melting point of the metal (A) in the second metal paste.

On the other hand, the mean particle diameter (D50) of the powder of the active metal is preferably 0.1 to 20 µm. The third metal paste, as in the first metal paste, may further contain an organic binder, an organic solvent, a dispersant, a plasticizer, and the like, and is preferably adjusted to have a viscosity of 20 to 600 Pa·s at 25° C. in a state containing the organic solvent and the organic binder, in view of productivity of the metallized via-holed ceramic substrate.

The amount of the powder of the active metal contained in the third metal paste is preferably 1 to 10 parts by mass, and more preferably 1.5 to 6 parts by mass, based on 100 parts by mass of the powder of the metal (B) in the third metal paste, in view of the adhesion and conductivity of the metallized pattern 25 formed.

The third metal paste layer 24 can be formed by a known method such as screen printing, calendar printing, and pad printing of the third metal paste. The thickness of the third metal paste layer 24 is not particularly limited, but is generally 1 to 100 μm, and preferably 5 to 30 μm.

(Step (vi))

A fourth metal paste contains a powder of the metal (A) and may be the same as the second metal paste described above. Moreover, in order to improve smoothness of a face of the metallized pattern 25 after the firing, the metal (B) may be added to the fourth metal paste.

In the step of the second firing, the metal (A) in the fourth metal paste layer 26 only needs to melt and permeate into the metallized pattern. Thus the fourth metal paste layer 26 is formed in a position where the fourth metal paste layer 26 contacts with the third metal paste layer 24, preferably on the third metal paste layer 24. The fourth metal paste layer 26 can be formed by a known method such as screen printing, calendar printing, and pad printing of the forth metal paste.

The mean particle diameter (D50) of the powder of the metal (A) contained in the fourth metal paste is preferably 0.1 to 20 μm. If the powder of the metal (B) is added to the fourth metal paste, the mean particle diameter (D50) of the powder of the metal (B) is preferably 0.1 to 10 μm.

The fourth metal paste, likewise the first metal paste, may further contain an organic binder, an organic solvent, a dispersant, a plasticizer, and the like, and is preferably adjusted to have a viscosity of 20 to 600 Pa·s at 25° C. in a state containing the organic solvent and the organic binder, in view of productivity of the metallized via-holed ceramic substrate.

The fourth metal paste layer 26 may be layered in an amount which allows the voids to be filled, the voids being likely generated in the metallized pattern 25 formed. The amount of the metal (A) in the fourth metal paste layer 26 is preferably 20 parts by mass or more, and more preferably 40 parts by mass or more, and preferably 150 parts by mass or less, and more preferably 100 parts by mass or less, based on 100 parts by mass of the metal (B) in the third metal paste layer 24. If the powder of the metal (B) is added to the fourth metal paste, the amount of the metal (A) in the fourth metal paste layer 26 is preferably 20 parts by mass or more, and more preferably 40 parts by mass or more, and preferably 150 parts by mass or less, and more preferably 100 parts by mass or less, based on 100 parts by mass of the sum of the metal (B) in the third metal paste layer 24 and the metal (B) in the fourth metal paste layer 26.

Further, if the powder of the metal (B) is added to the fourth metal paste, the metal (B) in the fourth metal paste layer 26 is preferably 5 parts by mass or more, and more preferably 10 parts by mass or more, and preferably 100 parts by mass or less, and more preferably 80 parts by mass or less, based on 100 parts by mass of the metal (B) in the third metal paste layer 24.

The fourth metal paste layer 26 can be configured in a multilayer structure such that the content of the metal (A) in the paste layer satisfies the above range.

(Step (vii))

The step of the second firing can be performed in the same conditions as those in the step of the first firing.

In the method for manufacturing the metallized via-holed ceramic substrate 100b of the present invention, in the step of the first firing, the via-hold ceramic substrate 100a is formed which has the dense via 23 with good electroconductivity described above and has good adhesion between the electroconductive via 23 and the sintered ceramic substrate 10; and further in the step of the second firing, the metal (A) in the fourth metal paste 26 melted permeates into the metallized pattern to form thereby the dense metallized pattern 25. Moreover, the active metal in the third metal paste layer 24 reacts with the ceramic component to form the active layer between the metallized pattern 25 and the ceramic substrate 10, thereby enabling good adhesion of the metallized pattern 25.

<Second Method for Manufacturing Metallized Via-Holed Ceramic Substrate (Fifth Aspect of the Present Invention)>

A second method for manufacturing the metallized via-holed ceramic substrate is a method for manufacturing the same metallized via-holed ceramic substrate 100c by a procedure different from that of the first method for manufacturing the metallized via-holed ceramic substrate 100b described above. In the second method, the metallized via-holed ceramic substrate 100c is manufactured by one firing step. The second method comprises the following steps of:

(i) preparing a sintered ceramic substrate having a through-hole;

(ii) filling a first metal paste into the through-hole, the first metal paste containing a powder of a metal (B) having a higher melting point than a melting point of a metal (A), and a powder of an active metal;

(iii) layering a third metal paste containing a powder of the metal (B) having a higher melting point than the melting point of the metal (A), and a powder of the active metal, thereby forming, in a position to form a wiring pattern, a third metal paste layer where the third metal paste contacts with the first metal paste;

(iv) layering a fifth metal paste containing a powder of the metal (A) having a melting point of 600° C. to 1100° C., thereby forming a fifth metal paste layer on the third metal paste layer; and (v) firing the substrate obtained via the steps (i) to (iv).

Figure 1C:
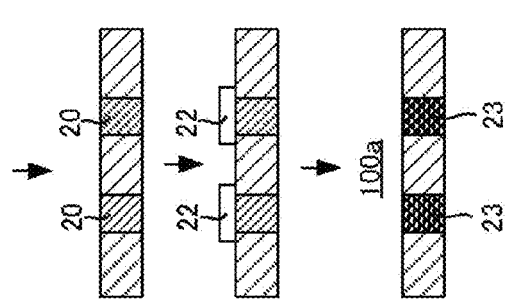
FIG. 1C is a conceptual diagram illustrating each step of the method for manufacturing the metallized via-holed ceramic substrate 100c, in the fifth aspect of the present invention.

The steps (i) and (ii) are the same as the steps (i) and (ii) in the method for manufacturing the via-holed ceramic substrate 100a (third aspect of the present invention) described above; and the first and third metal pastes are also the same as those explained in the third and fourth aspects of the present invention. Hereinafter, the steps (iii) to (v) will be explained with reference to FIG. 1C.

(Step (iii))

A third metal paste layer 24 is formed in a position to form a metallized pattern on a face(s) of the sintered ceramic substrate 10 where the third metal paste contacts with the first metal paste filled in the through-hole in the step (ii). This forming method is the same as the step (v) in the above first method for manufacturing the metallized via-holed ceramic substrate 100b.

(Step (iv))

A method of forming a fifth metal paste layer 27 is basically the same as the step (vi) in the above first method for manufacturing the metallized via-holed ceramic substrate 100b.

The fifth metal paste may contain only a powder of the metal (A) as an electroconductive component, but may also contain the powder of the metal (B).

The mean particle diameter (D50) of the powder of the metal (A) contained in the fifth metal paste is preferably 0.1 to 20 μm. If the powder of the metal (B) is added to the fifth metal paste, the mean particle diameter (D50) of the powder of the metal (B) is preferably 0.1 to 10 μm.

The fifth metal paste, likewise the first metal paste, may further contain an organic binder, an organic solvent, a dispersant, a plasticizer, and the like, and is preferably adjusted to have a viscosity of 20 to 600 Pa·s at 25° C. in a state containing the organic solvent and the organic binder, in view of productivity of the metallized via-holed ceramic substrate 100c.

The fifth metal paste layer 27 needs to be formed in a way such that an amount thereof is ensured because the metal (A) in the fifth metal paste layer 27 melts and flows into not only the electroconductive via 23 formed (voids in the powder of the metal (B) in the first metal paste layer 20) but also the metallized pattern 25 (voids in the powder of the metal (B) in the third metal paste layer 24). Thus, the amount of the metal (A) in the fifth metal paste layer 27 is preferably 20 parts by mass or more, and more preferably 40 parts by mass or more, and preferably 150 parts by mass or less, and more preferably 100 parts by mass or less, based on 100 parts by mass of the sum of the metal (B) in the first metal paste layer 20 and the metal (B) in the third metal paste layer 24. If the powder of the metal (B) is added to the fifth metal paste layer 27, the amount of the metal (A) in the fifth metal paste layer 27 is preferably 20 parts by mass or more, and more preferably 40 parts by mass or more, and preferably 150 parts by mass or less, and more preferably 100 parts by mass or less, based on 100 parts by mass of the sum of the metal (B) in the first metal paste 20, the metal (B) in the third metal paste layer 24 and the metal (B) in the fifth metal paste layer 27.

If the fifth metal past layer 27 contains the metal (B), the content ratio thereof is preferably 5 to 100 parts by mass, and more preferably 10 to 80 parts by mass, based on 100 parts by mass of the sum of the metal (B) in the third metal paste layer 24.

The fifth metal paste layer 27 can be configured to have a multilayer structure. For example, in order to inhibit diffusion of the active metal contained in the third metal paste layer 24, a fifth metal paste layer X containing the powder of the metal (A) can be layered on the third metal paste layer 24, and a fifth metal paste layer Y containing the powder of the metal (A) can be further layered thereon. At this time, the amount of the powder of the metal (A) preferably satisfies the blending quantity described above, in terms of the fifth metal paste layer X and the fifth metal paste layer Y in total. The same shall apply also in the case of using the powder of the metal (B).

With the fifth metal paste layer 27 having a multilayer structure, an upper metal paste layer which does not contain the powder of the active metal is formed, thereby enabling inhibition of the active metal component (e.g. titanium component) from moving to a surface of the metallized pattern 25, and enabling the surface of the metallized pattern 25 with good plating properties, and reductions of craters on the surface of the metallized pattern 25. Moreover, since the active metal component is inhibited from moving to the surface of the metallized pattern 25, and thereby the active layer is sufficiently formed in the interface between the sintered ceramic substrate 10 and the metallized pattern 25, the adhesion of the metallized pattern 25 is further improved.
(Step (v))

The firing step is the same as the step (iv) in the method for manufacturing the via-holed ceramic substrate 100b (third aspect of the present invention) described above.

In the second method for manufacturing the metallized via-holed ceramic substrate 100c, in the firing step, the metal (A) in the fifth metal paste layer 27 melts and permeates into the metallized pattern 25 thereunder (voids in the powder of the metal (B) in the third metal paste layer 24) and the via 23 (voids in the powder of the metal (B) in the through-hole 12), thereby forming the electroconductive via 23 and the metallized pattern 25 which are dense and have good electroconductivity.

<Via-Holed Ceramic Substrate (First Aspect of the Present Invention) and Metallized Via-Holed Ceramic Substrate (Second Aspect of the Present Invention)>

The via-holed ceramic substrate 100a and the metallized via-holed ceramic substrates 100b and 100c manufactured in the manufacturing methods described above comprise the dense via 23 and the dense metallized pattern 25, which both have good electroconductivity. Moreover, the active layer is formed in the interface between the via 23 and the sintered ceramic substrate 10, and between the metallized pattern 25 and the sintered ceramic substrate 10, therefore providing good adhesion between the via 23 and the sintered ceramic substrate 10, and between the metallized pattern 25 and the sintered ceramic substrate 10.

In the via-holed ceramic substrate 100a manufactured in the above method, the thickness of the active layer formed in the interface between the via 23 and the sintered ceramic substrate 10 is 0.1 to 2 μm. In the metallized via-holed ceramic substrates 100b and 100c manufactured in the above methods, the thickness of the active layer formed in the interface between the metallized pattern 25 and the sintered ceramic substrate 10 is 0.1 to 2 μm.

The resistivity of the via 23 measured by a four-probe method in the via-holed ceramic substrate 100a and the metallized via-holed ceramic substrates 100b and 100c of the present invention can be set at preferably $1.5 \times 10^{-7}$ Ω·m or less, and more preferably $1.0 \times 10^{-7}$ Ω·m or less.

The resistivity of the metallized pattern 25 measured by a four-probe method in the metallized via-holed ceramic substrates 100b and 100c of the present invention can be set to preferably $1.5 \times 10^{-7}$ Ω·m or less, and more preferably $1.0 \times 10^{-8}$ Ω·m or less. The thickness of the metallized pattern 25 is not particularly limited but is normally 5 to 100 μm.

The adhesion of the metallized pattern 25 in the metallized via-holed ceramic substrates 100b and 100c is measured in the following way: Ni/Au plating is performed on the face of the metallized pattern 25 of the metallized via-holed ceramic substrates 100b and 100c; a 42 alloy nail head pin having a tip diameter of 1.1 mm and having its tip surface nickel-plated is soldered perpendicularly on the plated film by Pb—Sn solder; and the nail head pin is pulled in the perpendicular direction at a rate of 10 mm/min. The strength of the pulling force at a time when the nail head pin comes off is determined to be the bond strength.

The via-holed ceramic substrate 100a and the metallized via-holed ceramic substrates 100b and 100c of the present invention have the electroconductive via having the electroconductive metal closely filled in the through-hole, the electroconductive metal containing the metal (A) having a melting point of 600° C. to 1100° C., the metal (B) having a melting point higher than the melting point of the metal (A), and the active metal. The electroconductive via closely filled refers to a via in which the ratio of the area of voids is 5% or less, based on the entire area of a cross section of the via as 100%, when the cross section of the via is observed by a scanning electron microscope at a magnification of 1000. In the present invention, by further adjusting the conditions, it is also possible to form the electroconductive via in which the ratio of the area of voids is less than 1%. Obviously, in the best configuration, the ratio of the area of voids is 0% (i.e. voids are not observed).

EXAMPLES

The performances of via-holed ceramic substrates and metallized via-holed ceramic substrates obtained in the following Examples and Comparative Examples were evaluated in the following methods.
<Evaluation Methods>
(Evaluation of Densification of Electroconductive Via)

The via-holed ceramic substrates and the metallized via-holed ceramic substrates obtained in the following Examples and Comparative Examples were embedded in resin and polished to prepare samples for observing cross sections of the via-holed ceramic substrates and the metallized via-holed ceramic substrates. The obtained observation samples were observed using a scanning electron microscope (S-3400N manufactured by Hitach High Technologies. Co., Ltd.) (observation magnification of 1000), to evaluate the amount of voids in the electroconductive via. When the ratio of the area of voids to the entire area of the cross section of the electroconductive via is less than 1%, it was evaluated as good; when the ratio was greater than or equal to 1% and less than 5%, it was evaluated as average; and when the ratio was 5% or more, it was evaluated as bad. The results are shown in Table 2.
(Active Layer: Checking Presence of Titanium Nitride Layer)

The samples for observing the cross sections of the via-holed ceramic substrates and the metallized via-holed ceramic substrates obtained above were observed using the scanning electron microscope to see if there was a titanium nitride layer (TiN layer) in the interface between the sintered substrate and the electroconductive via. The results are shown in Table 2.
(Evaluation of Bond Strength)

About 2.5 µm-thick electroless nickel plating was given over the metallized patterns of the metallized substrates for evaluation obtained in the following Examples and Comparative Examples, and then, about 0.4 µm-thick electroless gold plating was given. Thereafter, the bond strength was evaluated in the following procedure. A 42 alloy nail head pin having a tip diameter of 1.1 mm and having its tip surface nickel-plated was soldered, by Pb—Sn solder, on each of 2 mm-square plated metallized patterns in a manner perpendicular to the substrate; and the nail head pin was pulled in the perpendicular direction at a rate of 10 mm/min. The load generated when it broke off from the substrate was recorded. The same test was performed five times to calculate an average value of the load. The results are shown in Table 2.
(Evaluation of Volume Resistivity)

The volume resistivity of 0.4 mm-wide linear metallized patterns formed on the metallized substrates for evaluation obtained in the following Examples and Comparative Examples was measured by the four-probe method. The results are shown in Table 2.

Example 1

First Aspect and Third Aspect of the Present Invention (Preparation of First Metal Paste)

One hundred parts by mass of copper powder having a mean particle diameter (D50) of 5 µm as the powder of the metal (B), 3 parts by mass of titanium hydride powder having a mean particle diameter (D50) of 5 µm as the powder of the active metal, and a vehicle obtained by dissolving poly(alkyl methacrylate) in terpineol were premixed using a mortar and then distributed using three roll mills to prepare a first metal paste.
(Preparation of Second Metal Paste)

Ag—Cu alloy powder having a mean particle diameter (D50) of 6 µm (BAg-8: melting point 780° C., composition: silver 72 mass %-copper 28 mass %) as the powder of the metal (A) and a vehicle obtained by dissolving poly(alkyl methacrylate) in terpineol were premixed using a mortar and then distributed using three roll mills to prepare a second metal paste.
(Manufacturing of Via-Holed Ceramic Substrate)
(Step (i), Step (ii))

The first metal paste described above was filled into a 0.2 mm-diameter through-hole 12 of a 0.64 mm-thick sintered aluminum nitride substrate (sintered ceramic substrate 10) (manufactured by Tokuyama Corporation, Product name SH-30) by screen printing using a metal mask, and was dried at 100° C. for 10 minutes. Then, both faces of the substrate were buffed to completely remove the first metal paste which protruded to the faces of the substrate, washed with water, and dried at 100° C. for 10 minutes.
(Step (iii))

Further, the second metal paste described above was printed by screen printing using a metal mask having a through-hole with a diameter of 0.25 mm and was dried at 100° C. for 10 minutes to form the second metal paste layer 22. At this time, the second metal paste layer 22 was formed substantially cylindrically to cover the first metal paste 20 filled in the through-hole 12 of the substrate. At this time, the thickness of the second metal paste layer 22 was adjusted so that the amount of the powder of the metal (A) contained in the second metal paste layer 22 with respect to 100 parts by mass of the powder of the metal (B) contained in the first metal paste 20 filled in the through-hole 12 (A/B×100) was 80 parts by mass.
(Step (iv))

Then, the substrate was fired under vacuum at 900° C. for 30 minutes to form an electroconductive via 23 in the through-hole 12, and thereby a via-holed ceramic substrate 100a was obtained. At this time, the substrate was fired in a state of being accommodated in a setter made of aluminum nitride (in a closed container). The analysis and the evaluation described above were conducted on the obtained via-holed ceramic substrate 100a. The results are shown in Table 2.
(Preparation of Metallized Substrate for Evaluation)

The adhesion (bond strength) and the volume resistivity of the electrocondcutive via 23 of the via-holed ceramic substrate were hard to evaluate in the state of being filled in the through-hole 12. Thus, instead, a metal paste was printed on an aluminum nitride substrate and was fired to prepare and evaluate a metallized substrate for evaluation. The first metal paste described above was printed on a 0.64 mm-thick sintered aluminum nitride substrate (manufactured by Tokuyama Corporation; product name: SH-30) by screen printing and was dried at 100° C. for 10 minutes to form a first metal paste layer having a 2 mm-square pad shape and a 0.4 mm-wide linear pattern. Then, the second metal paste described above was printed on top of the first metal paste layer by screen printing and was dried at 100° C. for 10 minutes to form a second metal paste layer. At this time, the thickness of the second metal paste layer was adjusted so that the powder of the metal (A) contained in the second metal paste layer was 80 parts by mass based on 100 parts by mass of the powder of the metal (B) contained in the first metal paste layer. Then, the substrate was fired under vacuum at 900° C. for 30 minutes, and thereby the metallized substrate for evaluation was obtained. At this time, the substrate was fired in a state of being accommodated in a setter made of aluminum nitride (in a closed container). Using the obtained metallized substrate for evaluation, the adhesion (bond strength) and the volume resistivity were evaluated in the aforementioned manner. The results are shown in Table 2.

Examples 2 to 5

First Aspect and Third Aspect of the Present Invention

Except for setting the raw material composition of the paste as shown in Table 1 and setting the firing conditions as shown in Table 2, a via-holed ceramic substrate 100a and a metallized substrate for evaluation were prepared in the same manner as in Example 1, and were analyzed and evaluated in the aforementioned manner. The results are shown in Table 2.

Example 6

Second Aspect and Fourth Aspect of the Present Invention (Preparation of Third Metal Paste)
Twelve parts by mass of copper powder having a mean particle diameter (D50) of 0.3 µm and 59 parts by mass of copper powder having a mean particle diameter (D50) of 2 µm were used as the powder of the metal (B), and further, 29 parts by mass of silver powder having a mean particle diameter (D50) of 0.6 µm were used. Based on 100 parts by mass of the sum of the copper powders and the silver powder, 5 parts by mass of titanium hydride powder having a mean particle diameter (D50) of 5 µm as the powder of the active metal, and a vehicle obtained by dissolving poly(alkyl methacrylate) in terpineol were premixed using a mortar and then distributed using three roll mills to prepare a third metal paste.
(Preparation of Fourth Metal Paste)
Fifty parts by mass of Ag—Cu alloy powder having a mean particle diameter (D50) of 6 µm (BAg-8, composition: silver 72 mass %-copper 28 mass %) was used as the powder of the metal (A). The Ag—Cu alloy powder was mixed with 50 parts by mass of copper powder having a mean particle diameter (D50) of 0.3 µm. Furthermore, a vehicle obtained by dissolving poly(alkyl methacrylate) in terpineol was added to the sum of the Ag—Cu alloy powder and the copper powder, and premixed using a mortar and then distributed using three roll mills to prepare a fourth metal paste.
(Manufacturing of Metallized Via-Holed Ceramic Substrate)
(Step (v))
The third metal paste described above was printed on the via-holed ceramic substrate 100a prepared in Example 1 in a manner to cover the via 23, and was dried at 100° C. for 10 minutes to form a third metal paste layer a. A third metal paste layer b was also formed on a back face of the substrate in the same manner.
(Step (vi))
Then, the fourth metal paste described above was printed on top of the third metal paste layer a by screen printing and was dried at 100° C. for 10 minutes to form a fourth metal paste layer a. A fourth metal paste layer b was also formed on the back face of the substrate in the same manner (the back face not shown in the figure). At this time, the thickness of the fourth metal paste layer was adjusted (with the fourth metal paste layers a and b having the same thickness) so that the amount of the powder of the metal (A) contained in the fourth metal paste layer was 35 parts by mass on one face of the substrate, based on 100 parts by mass of the sum of the powder of the metal (B) contained in the third metal paste layer and the powder of the metal (B) contained in the fourth metal paste layer ($A_4/B_{3+4} \times 100$, where $A_4$ is the amount of the powder of the metal (A) contained in the fourth metal paste layer, and $B_{3+4}$ is the total amount of the powders of the metal (B) contained in the third and fourth metal paste layers).
(Step (vii))
Then, the substrate was fired under vacuum at 900° C. for 30 minutes, by which a metallized via-holed ceramic substrate 100b having metallized layers 25 on both faces of the substrate was obtained. At this time, the substrate was fired in a state of being accommodated in a setter made of aluminum nitride (in a closed container). Regarding the obtained metallized via-holed ceramic substrate 100b, the densification of the electroconductive via 23 was evaluated, and the presence of the titanium nitride layer was checked in the aforementioned manner. The results are shown in Table 2. From the obtained metallized via-holed ceramic substrate 100b, a sample for observing the cross section of the metallized via-holed ceramic substrate was prepared in the aforementioned manner and was observed using the scanning electron microscope. The metallized patterns 25 on both faces of the substrate were adhered via the electroconductive via 23 without any defects such as voids. Moreover, there were no defects such as dents caused by the electroconductive via 23, on the face of the metallized pattern 25.

Example 7

Second Aspect and Fifth Aspect of the Present Invention (Preparation of First Metal Paste)
A first metal paste was prepared in the same manner as the first metal paste in Example 1.
(Preparation of Third Metal Paste)
A third metal paste was prepared in the same manner as the third metal paste in Example 6.
(Preparation of Fifth Metal Paste X)
A fifth metal paste X was prepared in the same manner as the fourth metal paste in Example 6.
(Preparation of Fifth Metal Paste Y)
A fifth metal paste Y was prepared in the same manner as the second metal paste in Example 1.
(Manufacturing of Metallized Via-Holed Ceramic Substrate 100c)
(Step (i), Step (ii))
The first metal paste described above was filled into a 0.2 mm-diameter through-hole 12 of a 0.64 mm-thick sintered aluminum nitride substrate (manufactured by Tokuyama Corporation; product name: SH-30) by screen printing using a metal mask, and was dried at 100° C. for 10 minutes. Then, both faces of the substrate were buffed to completely remove the first metal paste which protruded to the faces of the substrate.
(Step (iii))
Then, the third metal paste described above was printed on the substrate by screen printing in a manner to cover the through-hole 12 filled with the first metal paste and was dried at 100° C. for 10 minutes to form a third metal paste layer 24. The third metal paste layer was also formed on the back face of the substrate in the same manner (the back face not shown in the figure).

(Step (iv))

Then, the fifth metal paste X described above was printed on top of the third metal paste layer 24 by screen printing and was dried at 100° C. for 10 minutes to form a fifth metal paste layer X. The fifth metal paste layer X was also formed on the back face of the substrate in the same manner. Moreover, the fifth metal paste Y described above was printed on the fifth metal paste layer X by screen printing using a metal mask having a through-hole with a diameter of 0.25 mm and was dried at 100° C. for 10 minutes to form a fifth metal paste layer Y. The fifth metal paste layer Y was also formed on the back face of the substrate in the same manner. At this time, the fifth metal paste layer Y was formed substantially cylindrically so that the center of the circular printed pattern viewed in a direction perpendicular to the face(s) of the substrate was disposed at a position where it almost overlapped the center of each through-hole of the substrate. Moreover, the thickness of the fifth metal paste layer Y was adjusted so that the amount of the powder of the metal (A) contained in the fifth metal paste layers was 50 parts by mass based on 100 parts by mass of the sum of the powder of the metal (B) contained in the first metal paste filled in the through-hole 12, the powder of the metal (B) contained in the third metal paste layer, and the powder of the metal (B) contained in the fifth metal paste layer X ($A_5/B_{1+3+5} \times 100$, where $A_5$ is the amount of the powder of the metal (A) contained in the fifth metal paste layers X and Y, and $B_{1+3+5}$ is the total amount of the powders of the metal (B) contained in the first, third and fifth metal paste layers).

(Step (v))

Figure 2:
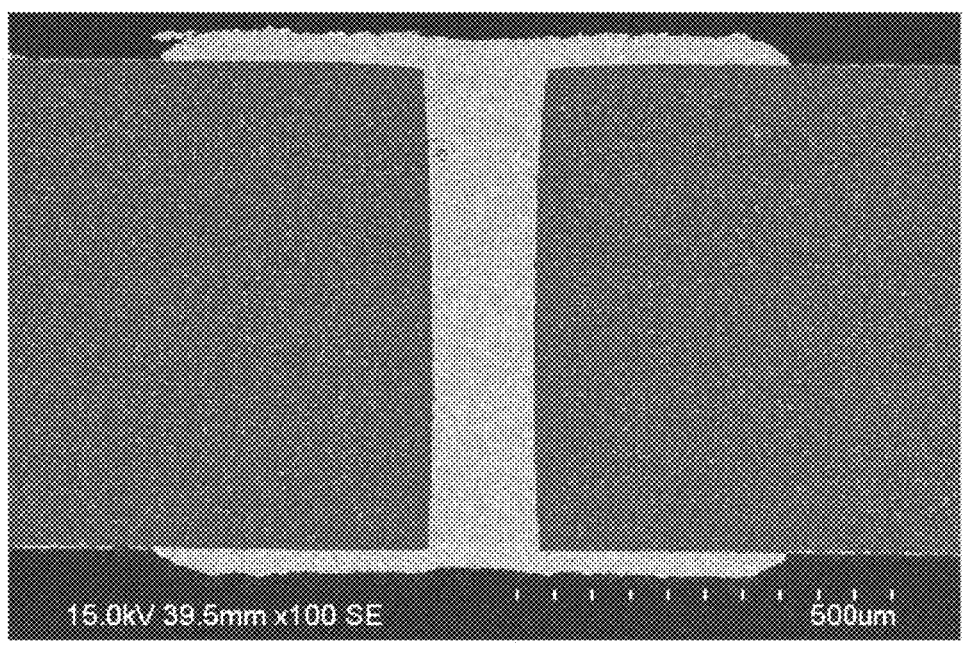
FIG. 2 is a scanning electron micrograph of an electroconductive via of a metallized via-holed ceramic substrate obtained in Example 7.
Figure 3C:
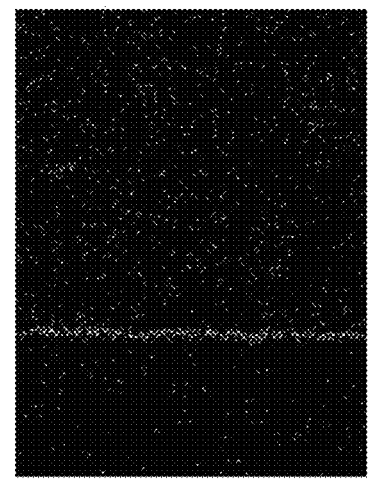
FIG. 3C illustrates quantitative determination of a TiKα1 ray.
Figure 3E:
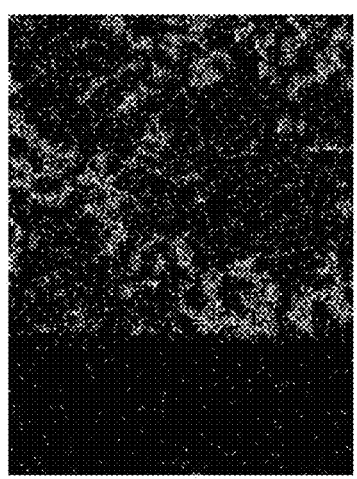
FIG. 3E illustrates quantitative determination of an AgLα1 ray.
Figure 3B:
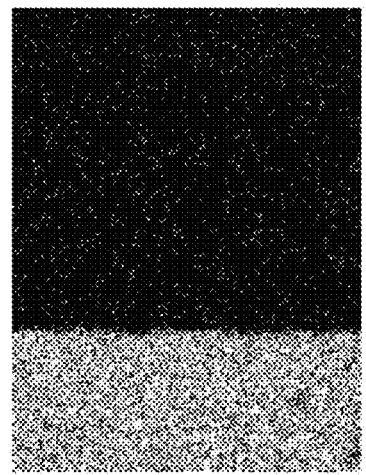
FIG. 3B illustrates quantitative determination of an AlKα1 ray.
Figure 3D:
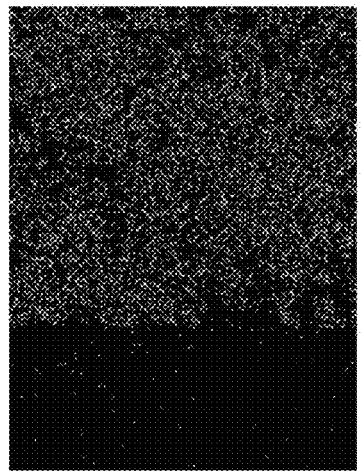
FIG. 3D illustrates quantitative determination of a CuKα1 ray.
Figure 3A:
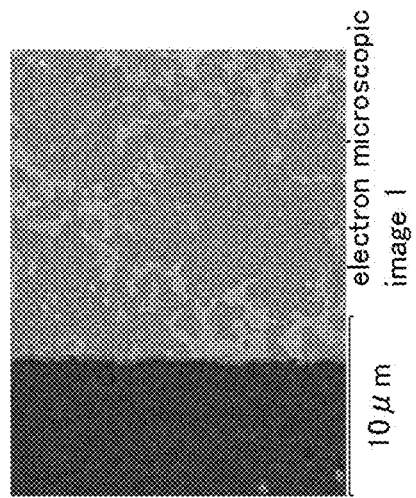
FIG. 3A is a SEM backscattered electron image.

Then, the substrate was fired under vacuum at 900° C. for 30 minutes, by which the metallized via-holed ceramic substrate 100c having the metallized layers on both faces of the substrate was obtained. At this time, the substrate was fired in a state of being accommodated in a setter made of aluminum nitride (in a closed container). Regarding the obtained metallized via-holed ceramic substrate 100c, the densification of the electroconductive via was evaluated, and the presence of the titanium nitride layer was checked in the aforementioned manner. The results are shown in Table 2. Moreover, a sample for observing the cross section of the metallized via-holed ceramic substrate was prepared in the aforementioned manner and was subjected to observation using the scanning electron microscope and element mapping using an energy dispersive X-ray analyzer. FIG. 2 shows a scanning electron micrograph of the electroconductive via 23. FIG. 3 show element mapping photographs in the vicinity of the interface between the sintered aluminum nitride substrate 10 and the electroconductive via 23. It can be confirmed from FIG. 2 that the metallized patterns 25 on both faces of the substrate are bonded via the electroconductive via 23 without any defects such as voids. Moreover, it can be confirmed from FIG. 3 that the titanium nitride layer is formed in the interface between the sintered substrate 10 and the electroconductive via 23, because the sintered substrate 10 and the electroconductive via 23 are bonded with no defects such as voids and because the titanium component is unevenly distributed in the interface.

Example 8

Second Aspect and Fifth Aspect of the Present Invention

Except for setting the raw material composition of the paste as shown in Table 1, a metallized via-holed ceramic substrate 100c was prepared in the same manner as in Example 7. The densification of the electroconductive via 23 was evaluated, and the presence of the titanium nitride layer was examined in the aforementioned manner. However, the fifth metal paste layer Y was not formed when the metallized via-holed ceramic substrate 100c was prepared; and the thickness of the fifth metal paste layer X was adjusted so that the amount of the powder of the metal (A) contained in the fifth metal paste layer was 80 parts by mass based on 100 parts by mass of the sum of the powder of the metal (B) contained in the first metal paste filled in the through-hole 12 and the powder of the metal (B) contained in the third metal paste layer ($A_5/B_{1+3} \times 100$, where $A_5$ is the amount of the powder of the metal (A) contained in the fifth metal paste layer, and $B_{1+3}$ is the total amount of the powders of the metal (B) contained in the first and third metal paste layers). The results are shown in Table 2.

Comparative Examples 1 to 3

Except for setting the raw material composition of the paste as shown in Table 1, the via-holed ceramic substrate and the metallized substrate for evaluation were prepared in the same manner as in Example 1, and the following analysis and evaluation were performed. In Comparative Examples 1 and 3, the second metal paste layer 22 was not formed when the via-holed ceramic substrate and the metallized substrate for evaluation were prepared. The results are shown in Table 2.

TABLE 1

| | Composition Ratio of Metal in the Paste (Parts by Mass) | | | | | | | | | | |
|---|---|---|---|---|---|---|---|---|---|---|---|
| | Powder of Metal in the First Metal Paste/D50 μm | | | | Powder of Metal in the Second Metal Paste/D50 μm | | | | Powder of Metal in the Third Metal Paste/D50 μm | | |
| | Powder of Metal (B) | | | Powder of Active Metal | Powder of Metal (A) | Powder of Metal (A) | | | Powder of Metal (B) | | Powder of Active Metal |
| | Cu/5 | Ag/5 | Mo/5 | TiH$_2$/5 | BAg-8/6 | BAg-8/6 | Ag/5 | Cu/5 | Cu/0.3 | Cu/2 | Ag/0.6 | TiH$_2$/5 |
| Example 1 | 100 | — | — | 3 | — | 100 | — | — | | | | |
| Example 2 | 100 | — | — | 3 | — | — | 100 | — | | | | |
| Example 3 | — | 100 | — | 3 | — | 100 | — | — | | | | |
| Example 4 | — | — | 100 | 3 | — | — | 100 | — | | | | |
| Example 5 | — | — | 100 | 3 | — | — | — | 100 | | | | |
| Example 6 | 100 | — | — | 3 | — | 100 | — | — | 12 | 59 | 29 | 5 |
| Example 7 | 100 | — | — | 3 | — | | | | 12 | 59 | 29 | 5 |
| Example 8 | 100 | — | — | 3 | — | | | | 16 | 84 | — | 5 |
| Comparative Example 1 | 100 | — | — | 3 | — | | | | | | | |

TABLE 1-continued

| | | | | | | | | |
|---|---|---|---|---|---|---|---|---|
| Comparative Example 2 | 100 | — | — | — | — | 100 | — | — |
| Comparative Example 3 | 100 | — | — | 5 | 80 | | | |

| | Composition Ratio of Metal in the Paste (Parts by Mass) | | | | | | |
|---|---|---|---|---|---|---|---|
| | Powder of Metal in the Fourth Metal Paste/D50 μm | | Powder of Metal in the Fifth Metal Paste X/D50 μm | | Powder of Metal in the Fifth Metal Paste Y/D50 μm | | |
| | Powder of Metal (B) Cu/0.3 | Powder of Metal (A) BAg-8/6 | Powder of Metal (B) Cu/0.3 | Powder of Metal (A) BAg-8/6 | Powder of Metal (A) BAg-8/6 | A/B × 100 | $A_4/B_{3+4} \times 100$ $A_5/B_{1+3+5} \times 100$ |
| Example 1 | | | | | | 80 | |
| Example 2 | | | | | | 80 | |
| Example 3 | | | | | | 80 | |
| Example 4 | | | | | | 80 | |
| Example 5 | | | | | | 80 | |
| Example 6 | 50 | 50 | | | | 80 | 35 |
| Example 7 | | | 50 | 50 | 100 | | 50 |
| Example 8 | | | — | 100 | | | 80 |
| Comparative Example 1 | | | | | | — | |
| Comparative Example 2 | | | | | | 80 | |
| Comparative Example 3 | | | | | | — | |

TABLE 2

| | Firing Conditions | Evaluation of Densification | Presence of TiN Layer | Bond Strength (kgf) | Volume Resistivity ($\Omega \cdot m$) |
|---|---|---|---|---|---|
| Example 1 | 900° C.-30 min | good | yes | 11 | $3.3 \times 10^{-8}$ |
| Example 2 | 1000° C.-30 min | good | yes | 10 | $3.1 \times 10^{-8}$ |
| Example 3 | 900° C.-30 min | good | yes | 11 | $2.6 \times 10^{-8}$ |
| Example 4 | 1000° C.-30 min | good | yes | 10 | $9.8 \times 10^{-8}$ |
| Example 5 | 1100° C.-30 min | good | yes | 9 | $1.1 \times 10^{-7}$ |
| Example 6 | Firing 1: 900° C.-30 min Firing 2: 900° C.-30 min | good | yes | | |
| Example 7 | 900° C.-30 min | good | yes | | |
| Example 8 | 900° C.-30 min | good | yes | | |
| Comparative Example 1 | 900° C.-30 min | bad | no | — | $1.6 \times 10^{-7}$ |
| Comparative Example 2 | 900° C.-30 min | good | no | — | $2.6 \times 10^{-8}$ |
| Comparative Example 3 | 900° C.-30 min | bad | yes | 10 | $5.6 \times 10^{-8}$ |

In the manufacturing method of Comparative Example 1, the second metal paste layer 22 was not formed, so there was no liquid phase flowing into the through-hole 12 upon firing, thus leading to insufficient sintering, and formation of the titanium nitride layer was hardly seen. Therefore, there were many voids in the via. Moreover, the bond strength was so small that the metallized layer peeled off in a plating pretreatment when giving electroless nickel plating over the metallized substrate for evaluation. Therefore, the bond strength could not be tested. In the manufacturing method of Comparative Example 2, the first metal paste did not contain titanium hydride powder, so formation of the titanium nitride layer was not seen in the interface between the sintered aluminum nitride substrate 10 and the via in the obtained via-holed ceramic substrate, and many gaps were observed in the interface. As such, the bond strength was so small that the metallized layer peeled off in the plating pretreatment when giving electroless nickel plating over the metallized substrate for evaluation. Therefore, the bond strength could not be tested. In the manufacturing method of Comparative Example 3, the second metal paste layer 22 containing Ag—Cu alloy powder was not formed on the through-hole 12, but instead, the Ag—Cu alloy powder was added to the first metal paste. Thus, the voids in the metal powder in the paste were not filled upon sintering and remained in the via. Therefore, there were many voids in the via.

The above has described the present invention in association with the most practical and preferred embodiments thereof at present. The invention, however, is not limited to the embodiments disclosed in the specification, but various changes may be made, if desired, without departing from the essence or spirit of the invention which can be read from the claims and the entire specification. It should be understood that the via-holed ceramic substrate, the metallized via-holed ceramic substrate, the method for manufacturing the via-holed ceramic substrate, and the method for manufacturing the metallized via-holed ceramic substrate which involve such changes, are also intended to be within the technical scope of the present invention.

DESCRIPTION OF REFERENCE NUMERALS 10 sintered ceramic substrate
12 through-hole
20 first metal paste
22 second metal paste layer
23 electroconductive via
24 third metal paste layer
25 metallized pattern
26 fourth metal paste layer
27 fifth metal paste layer

The invention claimed is:

1. A via-holed ceramic substrate comprising:
a sintered ceramic substrate;
an electroconductive via formed in the sintered ceramic substrate, said electroconductive via having an electroconductive metal closely filled in a through-hole, said electroconductive metal containing a metal (A) having a melting point of 600° C. to 1100° C., a metal (B) having a melting point higher than the melting point of the metal (A), and an active metal; and
an active layer formed in the interface between the electroconductive via and the sintered ceramic substrate,
wherein the sintered ceramic substrate is a sintered aluminum nitride substrate;
the metal (A) having the melting point of 600° C. to 1100° C. is one or more selected from a group consisting of gold solder, silver solder, and copper; and
the metal (B) having the melting point higher than the melting point of the metal (A) is one or more selected from a group consisting of silver, copper, and gold.

2. The via-holed ceramic substrate according to claim 1, wherein the active layer is a reaction layer formed by a reaction of the active metal and a ceramic component of the sintered ceramic substrate.

3. The via-holed ceramic substrate according to claim 2, wherein the active metal is titanium;
the ceramic component to react with the titanium is nitrogen; and
the reaction layer is a titanium nitride layer.

4. A metallized via-holed ceramic substrate comprising:
the via-holed ceramic substrate according to claim 1; and
a wiring pattern formed on a front face and/or a back face of the via-holed ceramic substrate, said wiring pattern having an electroconductive metal containing a metal (A), a metal (B), and an active metal.

5. A method for manufacturing the via-holed ceramic substrate as in claim 1, comprising the steps of:
(i) preparing a sintered aluminum nitride substrate having a through-hole;
(ii) filling a first metal paste into the through-hole, said first metal paste containing a powder of a metal (B) having a higher melting point than a melting point of a metal (A), and a powder of an active metal;
(iii) layering a second metal paste containing a powder of the metal (A) having a melting point of 600° C. to 1100° C., thereby forming a second metal paste layer where the second metal paste contacts with the first metal paste filled in the through-hole; and
(iv) firing the substrate obtained via the steps (i) to (iii), wherein the metal (A) having the melting point of 600° C. to 1100° C. is one or more selected from a group consisting of gold solder, silver solder, and copper; and
the metal (B) having the melting point higher than the melting point of the metal (A) is one or more selected from a group consisting of silver, copper, and gold.

6. A method for manufacturing a metallized via-holed ceramic substrate that comprises:
a sintered ceramic substrate;
an electroconductive via formed in the sintered ceramic substrate, said electroconductive via having an electroconductive metal closely filled in a through-hole, said electroconductive metal containing a metal (A) having a melting point of 600° C. to 1100° C., a metal (B) having a melting point higher than the melting point of the metal (A), and an active metal;
an active layer formed in the interface between the electroconductive via and the sintered ceramic substrate; and
a wiring pattern formed on a front face and/or a back face of the via-holed ceramic substrate, said wiring pattern having an electroconductive metal containing a metal (A), a metal (B), and an active metal,
the method for manufacturing the via-holed ceramic substrate comprising the steps of:
(i) preparing a sintered ceramic substrate having a through-hole;
(ii) filling a first metal paste into the through-hole, said first metal paste containing a powder of a metal (B) having a higher melting point than a melting point of a metal (A), and a powder of an active metal;
(iii) layering a second metal paste containing a powder of the metal (A) having a melting point of 600° C. to 1100° C., thereby forming a second metal paste layer where the second metal paste contacts with the first metal paste filled in the through-hole;
(iv) firing the substrate obtained via the steps (i) to (iii) and thereafter;
(v) layering a third metal paste containing a powder of the metal (B) having a higher melting point than the melting point of the metal (A), and a powder of the active metal, thereby forming a third metal paste layer in a position to form a wiring pattern;
(vi) layering a fourth metal paste containing a powder of the metal (A) having a melting point of 600° C. to 1100° C., thereby forming a fourth metal paste layer on the third metal paste layer; and
(vii) firing the substrate obtained via the steps (i) to (vi).

7. A method for manufacturing a metallized via-holed ceramic substrate that comprises:
a sintered ceramic substrate;
an electroconductive via formed in the sintered ceramic substrate, said electroconductive via having an electroconductive metal closely filled in a through-hole, said electroconductive metal containing a metal (A) having a melting point of 600° C. to 1100° C., a metal (B) having a melting point higher than the melting point of the metal (A), and an active metal;
an active layer formed in the interface between the electroconductive via and the sintered ceramic substrate; and
a wiring pattern formed on a front face and/or a back face of the via-holed ceramic substrate, said wiring pattern having an electroconductive metal containing a metal (A), a metal (B), and an active metal,
the method for manufacturing the via-holed ceramic substrate comprising the steps of:
(i) preparing a sintered ceramic substrate having a through-hole;
(ii) filling a first metal paste into the through-hole, said first metal paste containing a powder of a metal (B) having a higher melting point than a melting point of a metal (A), and a powder of an active metal;

(iii) layering a third metal paste containing a powder of the metal (B) having a higher melting point than the melting point of the metal (A), and a powder of the active metal, thereby forming, in a position to form a wiring pattern, a third metal paste layer where the third metal paste contacts with the first metal paste;

(iv) layering a fifth metal paste layer containing a powder of the metal (A) having a melting point of 600° C. to 1100° C., thereby forming a fifth metal paste layer on the third metal paste layer; and (v) firing the substrate obtained via the steps (i) to (iv).

* * * * *